United States Patent
Liu et al.

(10) Patent No.: US 8,806,309 B2
(45) Date of Patent: Aug. 12, 2014

(54) METHOD FOR CONTROLLING MESSAGE-PASSING ALGORITHM BASED DECODING OPERATION BY REFERRING TO STATISTICS DATA OF SYNDROMES OF EXECUTED ITERATIONS AND RELATED CONTROL APPARATUS THEREOF

(75) Inventors: Zhen-U Liu, Taoyuan County (TW); Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 413 days.

(21) Appl. No.: 13/159,398

(22) Filed: Jun. 13, 2011

(65) Prior Publication Data

US 2012/0317462 A1 Dec. 13, 2012

(51) Int. Cl.
| | |
|---|---|
| *H03M 13/00* | (2006.01) |
| *H03M 13/37* | (2006.01) |
| *H03M 13/11* | (2006.01) |
| *H03M 13/17* | (2006.01) |
| *H03M 13/15* | (2006.01) |
| *H03M 13/09* | (2006.01) |
| *H03M 13/29* | (2006.01) |

(52) U.S. Cl.
CPC ...... *H03M 13/3753* (2013.01); *H03M 13/1142* (2013.01); *H03M 13/175* (2013.01); *H03M 13/1575* (2013.01); *H03M 13/09* (2013.01); *H03M 13/2942* (2013.01)
USPC ............................ 714/785; 714/760; 714/780

(58) Field of Classification Search
None
See application file for complete search history.

(56) References Cited

U.S. PATENT DOCUMENTS

| | | | | |
|---|---|---|---|---|
| 6,640,327 | B1 * | 10/2003 | Hallberg | 714/785 |
| 8,005,141 | B2 * | 8/2011 | He et al. | 375/240.03 |
| 8,051,363 | B1 * | 11/2011 | Liu | 714/780 |
| 8,381,069 | B1 * | 2/2013 | Liu | 714/759 |
| 2010/0042897 | A1 * | 2/2010 | Han et al. | 714/752 |
| 2013/0159819 | A1 * | 6/2013 | Jiang et al. | 714/799 |

* cited by examiner

*Primary Examiner* — Daniel McMahon
(74) *Attorney, Agent, or Firm* — Winston Hsu; Scott Margo

(57) ABSTRACT

A method for controlling a message-passing algorithm (MPA) based decoding operation includes: gathering statistics data of syndromes obtained from executed iterations; and selectively adjusting a decoding operation in a next iteration to be executed according to the statistics data. A control apparatus for controlling an MPA based decoder includes an adjusting circuit and a detecting circuit. The detecting circuit is coupled to the adjusting circuit, and used for gathering statistics data of syndromes obtained from executed iterations, and selectively controlling the adjusting circuit to adjust a decoding operation in a next iteration to be executed according to the statistics data.

18 Claims, 4 Drawing Sheets

| Iteration | 1 | 2 | 3 | 4 | 5 | 6 | 7 | 8 | 9 | 10 | |
|---|---|---|---|---|---|---|---|---|---|---|---|
| Calculated syndrome | S1 | S2 | S2 | S2 | S2 | S3 | S3 | S3 | S3 | S3 | |
| Saved syndrome (Before step 206) | ⊠ | S1 | S2 | S2 | S2 | S2 | S3 | S3 | S3 | S3 | |
| Saved syndrome (After step 206) | S1 | S2 | S2 | S2 | S2 | S3 | S3 | S3 | S3 | S3 | |
| Counter number (Before step 206) | ⊠ | 0 | 0 | 1 | 2 | 0 | 1 | 2 | 0 | 1 | |
| Counter number (After step 206) | 0 | 0 | 1 | 2 | 0 | 1 | 2 | 3 | 1 | 2 | |

FIG. 3

METHOD FOR CONTROLLING MESSAGE-PASSING ALGORITHM BASED DECODING OPERATION BY REFERRING TO STATISTICS DATA OF SYNDROMES OF EXECUTED ITERATIONS AND RELATED CONTROL APPARATUS THEREOF

BACKGROUND OF THE INVENTION

1. Field of the Invention

The disclosed embodiments of the present invention relate to a message-passing algorithm based decoding scheme, and more particularly, to a method for controlling a message-passing algorithm based decoding operation by selectively adjusting a decoding operation of a next iteration according to statistics data of syndromes of executed iterations and related control apparatus thereof.

2. Description of the Prior Art

Communication of information between computers and other electronic devices can be implemented using any of a variety of different standards and technologies. Channel coding and error correction techniques may be used to reduce errors in received signals introduced from distortion and other disturbances. Such coding and error correction may be implemented using an encoder and a decoder at the ends of the transmission channel.

For example, any decoding algorithm for low-density parity check (LDPC) codes may be used in the receiving end to decode the received codeword (i.e., received channel values). In general, iterative decoders are often used to converge on a correct decoded value. In one implementation, LDPC decoding is performed in the receiving end using a soft-decision, message-passing algorithm (MPA). The received bits (e.g., channel values) are treated as variables each representing the probability of the value being a "0" or a "1", and the variables are represented in the decoding algorithm as log likelihood ratios (LLRs). The message-passing algorithm passes messages (e.g., LLRs) from the variable nodes to the check nodes, calculates the syndrome of the current iteration, passes messages (e.g., LLRs) from the check nodes to the variable nodes, and iterates in this same way until a convergence is reached (e.g., check bits of the syndrome are all 0's).

However, one of the problems inherent to LDPC codes is the presence of trapping set(s). A trapping set is the set of bits that cannot be decoded to the correct values after any given number of iterations. Regarding an LDPC decoder with high signal-to-noise (SNR) additive white Gaussian noise (AWGN), an error type is a small trapping set. In general, the error bit number of the received bits is usually small. However, if the errors are located at some specific variable nodes, they would feed back wrong reliability values and cause a trapping set. To put it simply, when decoding a received codeword, an LDPC decoder may encounter one or more trapping sets that prevent the decoder from properly decoding the received codeword.

Thus, there is a need for an innovative MPA based decoder design which is capable of solving decoding errors resulted from trapping set(s).

SUMMARY OF THE INVENTION

In accordance with exemplary embodiments of the present invention, a method for controlling a message-passing algorithm based decoding operation by selectively adjusting a decoding operation of a next iteration according to statistics data of syndromes of executed iterations and related control apparatus are proposed to solve the above-mentioned problem.

According to a first aspect of the present invention, an exemplary method for controlling a message-passing algorithm (MPA) based decoding operation is disclosed. The exemplary method includes: gathering statistics data of syndromes obtained from executed iterations; and selectively adjusting a decoding operation in a next iteration to be executed according to the statistics data.

According to a second aspect of the present invention, an exemplary control apparatus for controlling a message-passing algorithm (MPA) based decoder is disclosed. The control apparatus includes an adjusting circuit; and a detecting circuit, coupled to the adjusting circuit, for gathering statistics data of syndromes obtained from executed iterations and selectively controlling the adjusting circuit to adjust a decoding operation in a next iteration to be executed according to the statistics data.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating the setting of the counter number, the calculated syndrome, and the saved syndrome in each of the iterations of the MPA based decoding of LDPC codes.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . .". Also, the term "coupled" is intended to mean either an indirect or direct electrical connection. Accordingly, if one device is electrically connected to another device, that connection may be through a direct electrical connection, or through an indirect electrical connection via other devices and connections.

Figure 1:
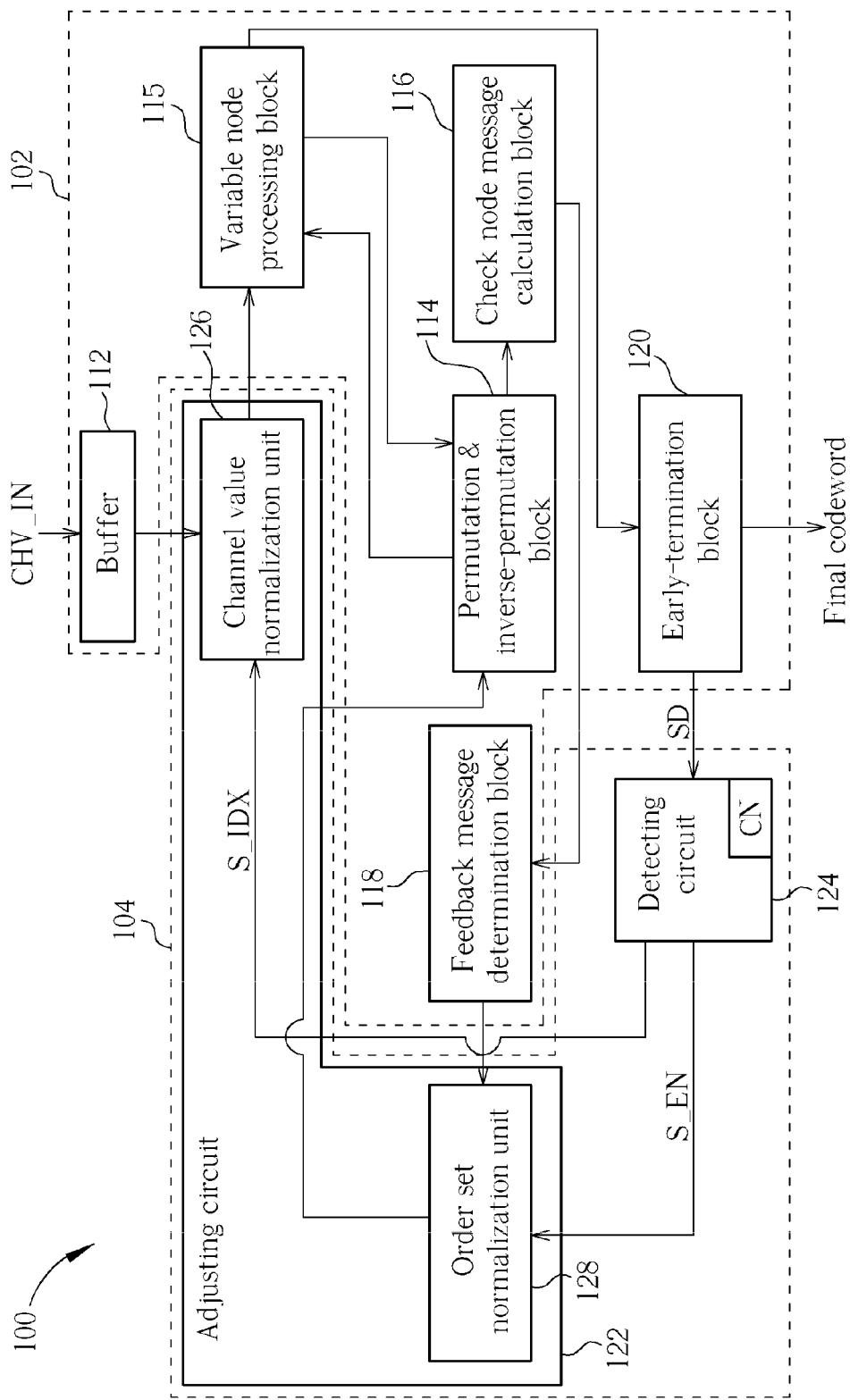
FIG. 1 is a block diagram illustrating a decoding apparatus according to an exemplary embodiment of the present invention.

To break the trapping set loop resulted from error bits located at specific variable nodes, the present invention proposes a control apparatus collaborating with a message-passing algorithm (MPA) based decoder. Please refer to FIG. 1, which is a block diagram illustrating a decoding apparatus according to an exemplary embodiment of the present invention. The decoding apparatus 100 includes an MPA based decoder (e.g., an LDPC decoder) 102 and a control apparatus 104. The MPA based decoder 102 includes a buffer 112, a permutation & inverse-permutation block 114, a variable node processing block 115, a check node message calculation block 116, a feedback message determination block 118, and an early-termination block 120. Regarding the control apparatus 104, it includes an adjusting circuit 122 and a detecting circuit 124, wherein the adjusting circuit 122 includes, but is not limited to, a channel value normalization unit 126 and an order set normalization unit 128. As the present invention focuses on the design of the control apparatus 104, the MPA based decoder 102 may be realized using any conventional decoder architecture. Therefore, the exemplary decoder architecture shown in FIG. 1 is for illustrative purposes only. The operation of the functional blocks included in the MPA based decoder 102 is briefly described as below.

The buffer 112 is used for receiving and buffering channel values (i.e., a received codeword) CHV_IN to be decoded. The channel values are set as the initial values of the variable nodes. The permutation & inverse-permutation block 114 controls the message passing between variable nodes and check nodes. In other words, the permutation & inverse-permutation block 114 establishes the desired paths linked between the variable nodes and the check nodes according to the desired LDPC matrix. The variable node processing block 115 calculates the A-Posteriori Probability (APP) values and the variable node value passed to the check node. The check node message calculation block 116 calculates the check node messages (i.e., order sets) of each check node. Based on the actually employed algorithm, the feedback message determination block 118 determines the feedback messages to be passed from the check nodes to the variable nodes. Similarly, the permutation & inverse-permutation block 114 also controls the delivery of the selected feedback messages. In a next iteration, soft bits of the variable nodes (i.e., APP values) are updated by adjusting the originally received channel values buffered in the buffer 112 according to the latest feedback messages provided by the check nodes. In each of iterations, the early-termination block 120 calculates one syndrome according to check node values, and determines if the MPA based decoding has been converged on a correct codeword.

As mentioned above, a trapping set is the set of bits that cannot be decoded to the correct values after any given number of iterations. The trapping set issue dominates LDPC error floor. To solve the trapping set issue, the adjusting circuit 122 therefore has the channel value normalization unit 126 inserted between the buffer 112 and the variable node processing block 115, and further has the order set normalization unit 128 inserted between the feedback message determination block 118 and the permutation & inverse-permutation block 114. Thus, the decoding operation of one iteration is allowed to be adjusted through the adjusting circuit 122, thereby breaking the trapping set loop to make the MPA base decoder 102 have the chance of converging on a correct codeword as desired. In addition to the adjusting circuit 122, the control apparatus 104 has the detecting circuit 124 implemented for gathering statistics data of syndromes SD obtained from executed iterations and selectively controlling the adjusting circuit 122 to adjust a decoding operation in a next iteration to be executed according to the statistics data. In this exemplary embodiment, the detecting circuit 124 detects the occurrence of trapping set(s) by gathering statistics data of syndromes SD obtained from executed iterations. For example, the detecting circuit 124 updates a counter number CN by counting a number of successive times a syndrome of a current iteration is identical to a syndrome of a previous iteration, and the detecting circuit 124 refers to the counter number CN for selectively controlling the adjusting circuit 122 to adjust the decoding operation in the next iteration to be executed. Therefore, when the syndrome of the current iteration is different from the syndrome of the previous iteration, the detecting circuit resets the counter number CN to an initial value (e.g., 0), and when the syndrome of the current iteration is identical to the syndrome of the previous iteration, the detecting circuit 124 adds an adjustment value (e.g., 1) to the counter number CN. To identify the occurrence of trapping set(s), the detecting circuit 124 checks if the counter number CN reaches a target value (e.g., 1, 2, or 3). When the counter number CN reaches the target value, the detecting circuit 124 controls the adjusting circuit 122 to adjust the decoding operation in the next iteration to be executed, and resets the counter number CN to the initial value.

As mentioned above, the adjusting circuit 122 includes the channel value normalization unit 126 and the order set normalization unit 128. Therefore, when the detecting circuit 124 determines that bits of the variable nodes include trapping set(s) by referring to the statistic data (e.g., the counter number CN of successive iterations having the same syndrome), the detecting circuit 124 generates an enable signal S_EN to control the order set normalization unit 128 and a normalization index signal S_IDX to control the channel value normalization unit 126. When notified by the enable signal S_EN, the order set normalization unit 128 is enabled to adjust all order sets of the check nodes. Then, the adjusted order sets are passed to the variable node processing block 115 for calculating the APP value through the message path determined by the permutation & inverse-permutation block 114. Similarly, when notified by the normalization index signal S_IDX, the channel value normalization unit 126 is operative to adjust all channel values (i.e., received bits) read from the buffer 112. Then, the adjusted channel values are passed to the variable node processing block 115 for calculating the APP value. Please note that the original channel values stored in the buffer 112 remain intact. To put it another way, the adjusting circuit 122 may adjust the decoding operation in the next iteration to be executed by adjusting all channel values and all order sets. For example, the order set normalization unit 128 may be configured to reduce all order sets (e.g. reduce the value of all check node messages) by perform a bit-shifting operation upon each order set, and the channel value normalization unit 126 may be configured to reduce all channel values by performing a bit-shifting operation upon each channel value. Please note that the order set normalization unit 128 may also be configured to reduce the value of at least part of the check node messages (e.g., reduce the value of 2000 check node messages of all 2048 check node messages), and the channel value normalization unit 126 may be configured to reduce at least part of the channel values (e.g., reduce the value of 1000 channel values of all 1024 channel values).

Figure 2:
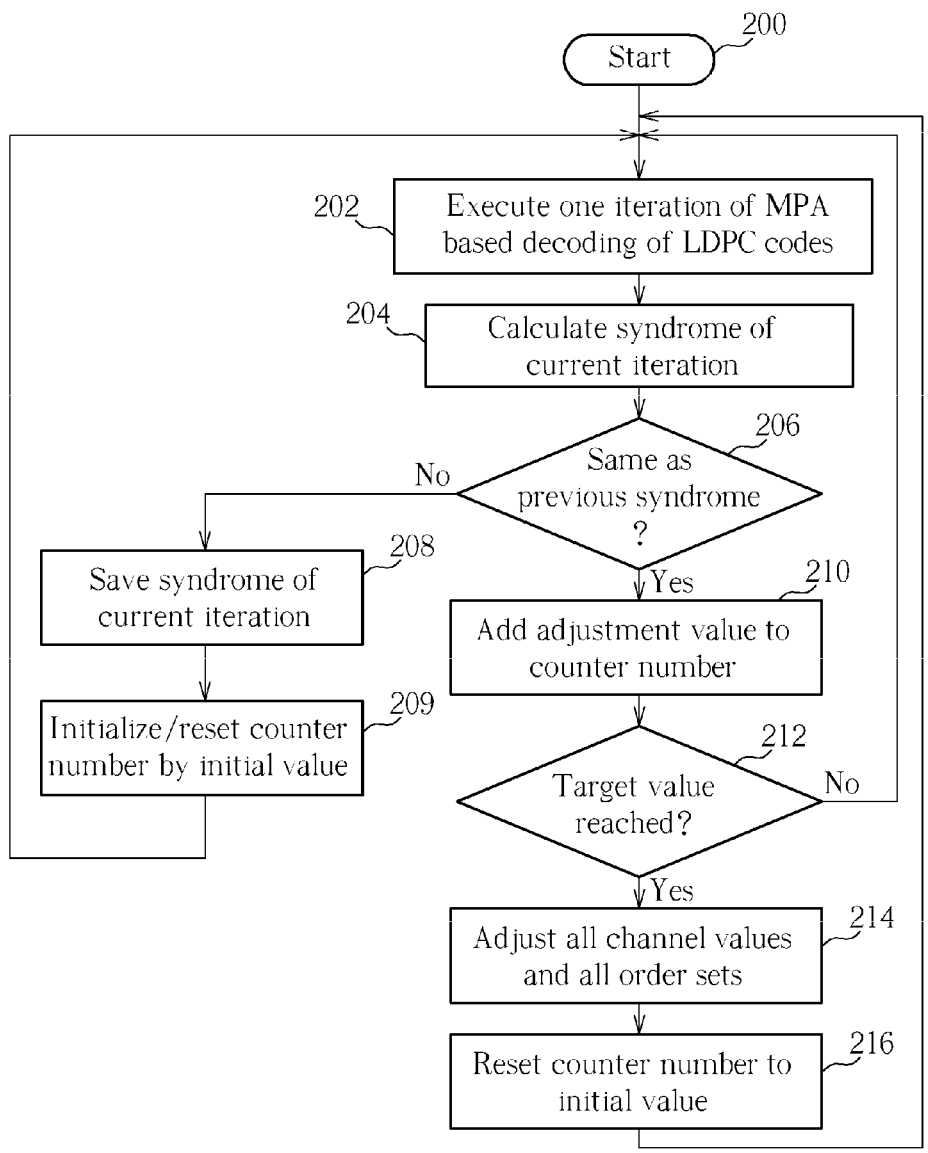
FIG. 2 is a flowchart of a method for controlling a message-passing algorithm based decoding operation according to an exemplary embodiment of the present invention.

Please refer to FIG. 2, which is a flowchart of a method for controlling a message-passing algorithm (MPA) based decoding operation according to an exemplary embodiment of the present invention. If the result is substantially the same, the steps are not required to be executed in the exact order shown in FIG. 2. The method may be employed by the decoding apparatus 100 shown in FIG. 1, and may be briefly summarized as follows.

Step 200: Start.

Step 202: Execute one iteration of the MPA based decoding of LDPC codes.

Step 204: Calculate a syndrome of a current iteration.

Step 206: Check if the syndrome of the current iteration is the same as a syndrome of a previous iteration. If yes, go to step 210; otherwise, go to step 208.

Step 208: Save the syndrome of the current iteration.

Step 209: Initialize/reset a counter number by an initial value (e.g., 0). Go to step 202.

Step 210: Add an adjustment value (e.g., 1) to the counter number.

Step 212: Check if the counter number reaches a target value (e.g., 3). If yes, go to step 214; otherwise, go to step 202.

Step 214: Adjust all channel values and all order sets (e.g., perform a bit-shifting operation upon each channel value and each order set to thereby reduce all channel values and all order sets).

Step 216: Reset the counter number to the initial value. Go to step 202.

In step 208, the syndrome of the current iteration is saved to be compared with a syndrome of a next iteration of the MPA based decoding of LDPC codes. That is, when the next iteration is started in step 202, the syndrome of the current iteration obtained in the previously executed step 208 would act as the syndrome of the previous iteration needed in the following step 206. It should be noted that the aforementioned initial value, the adjustment value, and/or the target value may be adjusted, depending upon actual design requirement/consideration.

For clarity, please refer to FIG. 3, which is a diagram illustrating the setting of the counter number, the calculated syndrome, and the saved syndrome during each of the iterations of the MPA based decoding of LDPC codes. As can be seen from the figure, in the $8^{th}$ iteration, step 212 detects that the counter number reaches the target value. Therefore, step 216 is executed to reset the counter number to the initial value for the next iteration (i.e., the $9^{th}$ iteration). Moreover, as step 206 finds that the calculated syndrome (i.e., the syndrome of the current iteration) and the saved syndrome (i.e., the syndrome of the previous iteration) are different in the $1^{st}$ iteration, the $2^{nd}$ iteration and $5^{th}$ iteration, the saved syndrome is updated/replaced by the calculated syndrome.

As a person skilled in the art can readily understand operation of each step shown in FIG. 2 after reading above paragraphs, further description is omitted here for brevity.

Figure 4:
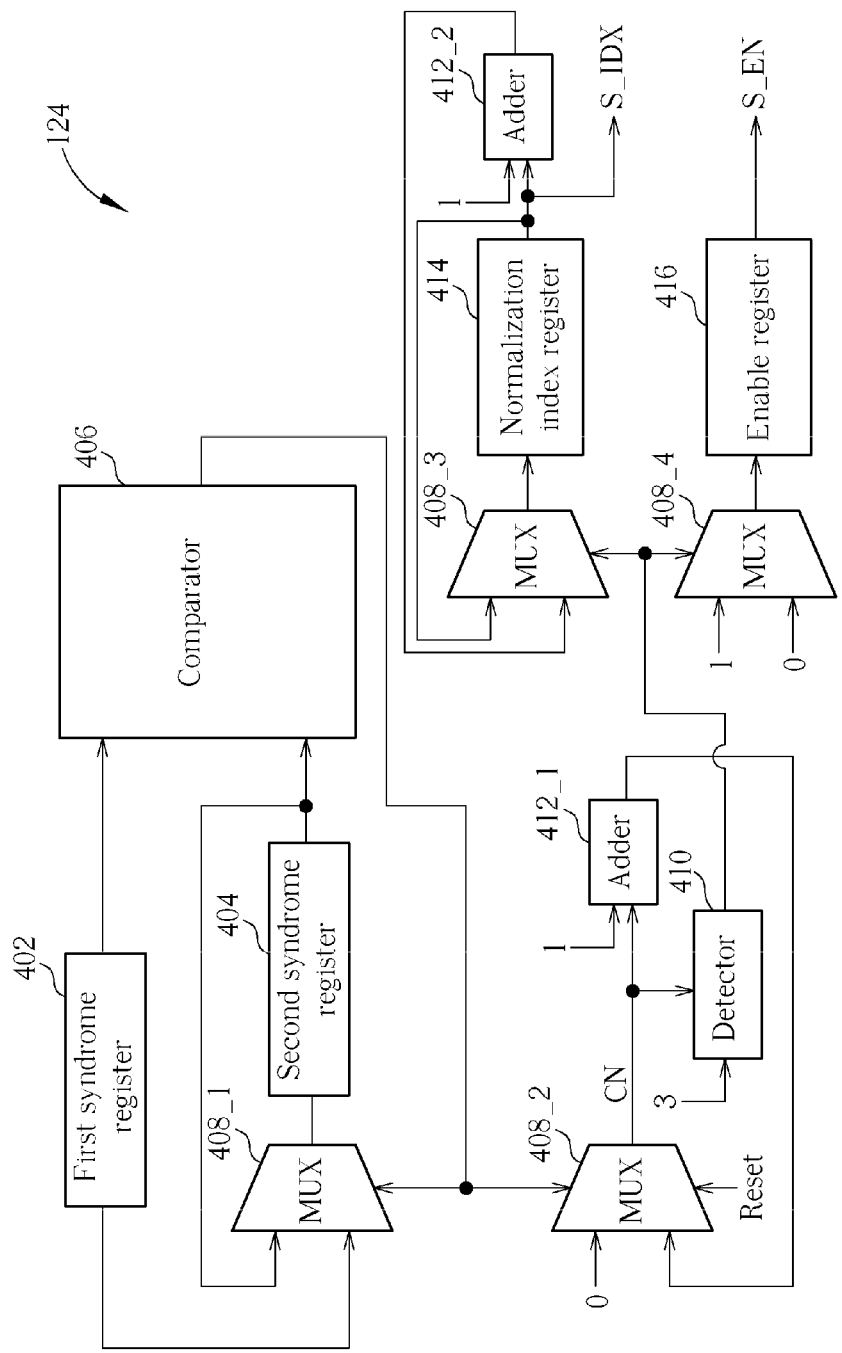
FIG. 4 is a diagram illustrating an exemplary implementation of a detecting circuit shown in FIG. 1.

Please refer to FIG. 4, which is a diagram illustrating an exemplary implementation of the detecting circuit 124 shown in FIG. 1. The detecting circuit 124 includes, but is not limited to, a first syndrome register 402, a second syndrome register 404, a comparator 406, a plurality of multiplexers 408_1, 408_2, 408_3, a detector 410, a plurality of adders 412_1, 412_2, a normalization index register 414, and an enable register 416. The first syndrome register 402 is used for storing a syndrome of a current iteration (i.e., the calculated syndrome mentioned above), and the second syndrome register 404 is used for storing a syndrome of a previous iteration (i.e., the saved syndrome mentioned above). The comparator 406 compares the syndromes stored in the first syndrome register 402 and the second register 404 to determine if two successive iterations have the same syndrome. When the comparison result indicates that the syndrome stored in the first syndrome register 402 is identical to the syndrome stored in the second syndrome register 404, the multiplexer 408_1 selects the syndrome stored in the second syndrome register 404 as its output for keeping the syndrome stored in the second syndrome register 404 unchanged; otherwise, the multiplexer 408_1 selects the syndrome stored in the first syndrome register 402 as its output for updating the syndrome stored in the second syndrome register 404 by the syndrome stored in the first syndrome register 402.

In addition, when the comparison result indicates that the syndrome stored in the first syndrome register 402 is identical to the syndrome stored in the second syndrome register 404, the multiplexer 408_2 selects an initial value (e.g., 0) as its output for making the counter number CN equal to the initial value; otherwise, the multiplexer 408_2 selects an output of the adder 412_1 as its output, wherein the adder 412_1 is implemented to add an adjustment value (e.g., 1) to the counter number CN.

When the detector 410 finds that the counter number CN does not reach a target value (e.g., 3) yet, the multiplexer 408_3 selects a normalization index stored in the normalization index register 414 as its output, wherein an initial value of the normalization index may be 0; otherwise, the multiplexer 408_3 selects an output of the adder 412_2 as its output for updating the normalization index stored in the normalization index register 414, wherein the adder 412_2 is implemented to add an adjustment value (e.g., 1) to the normalization index read from the normalization index register 414. It should be noted that an output of the normalization index register 414 also serves as the aforementioned normalization index signal S_IDX sent to the channel value normalization unit 126. Therefore, in this exemplary embodiment, the normalization index stored in the normalization index register 414 determines the number of bits to be shifted during the bit-shifting operation performed by the channel value normalization unit 126. In other words, the normalization index determines the adjusting degree of the channel value adjustment. Please note that the channel value normalization unit 126 can also achieve the channel value adjustment by any means other than the bit-shifting operation. In addition, the normalization index stored in the normalization index register 414 can be reset while the decoding process is done (no matter success or fail).

Besides, when the detector 410 finds that the counter number CN does not reach the target value (e.g., 3) yet, the multiplexer 408_4 selects a first logic value "0" as its output; otherwise, the multiplexer 408_4 selects a second logic value "1" as its output. It should be noted that an output of the enable register 416 acts as the aforementioned enable signal S_EN sent to the order set normalization unit 128. More specifically, when the multiplexer 408_4 selects the first logic value "0" as its output, the enable signal S_EN is deasserted; however, when the multiplexer 408_4 selects the second logic value "1" as its output, the enable signal S_EN is asserted to thereby activate the order set normalization unit 128 for applying a scaling factor (e.g., 0.5) to all order sets. Please note that the scaling factor can be configured as required at any time.

It should be noted that the counter number CN would be reset to the initial value after the enable signal S_EN and the normalization index signal S_IDX respectively triggers the order set normalization unit 128 and the channel value normalization unit 126. Thus, due to the counter number CN with the initial value smaller than the target value, the detector 410 controls the multiplexers 408_3 and 408_4, such that the multiplexer 408_4 selects the first logic value "0" as its output and the multiplexer 408_3 selects the current normalization index stored in the normalization index register 414 as its output. However, the normalization index stored in the normalization index register 414 will be increased by 1 again to further reduce the channel values read from the buffer 112 and the enable signal S_EN will be asserted again to further reduce the order sets generated from the check node message calculation block 116 when the trapping set loop is not successfully broken due to previous adjustment made to the channel values and the order sets.

Please note that adjusting the channel values and the order sets has equivalent effect as adjusting the A-Posteriori Probability (APP) values at the variable nodes. Since the APP values (and/or the variable node values passed to the check nodes) are calculated from the channel values and corresponding order sets (e.g. summing the channel values with corresponding order sets). People skilled in the art can readily understand that adjusting the APP values (or the variable node values passed to the check nodes), no matter adjusting the channel values and/or the order sets or not, may have chance to solve the trapping set issue. In other words, the proposed adjusting circuit 122 may have ability to adjust the APP values (or the variable node values passed to the check nodes) or may adjust the APP values (or the variable node values passed to the check nodes) in place of adjusting the channel values and/or order sets, which also falls into the scope of the present invention. The decoding operation of the next iteration is properly adjusted by means of the proposed adjusting circuit 122 having the channel value normalization unit 126 and the order set normalization unit 128 included therein. As all of the errors trapped in the variable nodes may be identified and corrected in the following one or more iterations through adjusting the channel values and the order sets, the LDPC error floor is lowered effectively.

In above exemplary embodiment, the channel value and the order set are both adjusted in response to the trapping set detection performed by the detecting circuit 124. However, this is for illustrative purposes only, and is not meant to be a limitation of the present invention. In one alternative design, the channel value normalization unit 126 shown in FIG. 1 may be omitted, thereby leaving the order set normalization unit 128 in the modified adjusting circuit. In another alternative design, the order set normalization unit 128 shown in FIG. 1 may be omitted, thereby leaving the channel value normalization unit 126 in the modified adjusting circuit. The same objective of breaking the trapping set loop and lowing the LDPC error floor may be achieved. To put it simply, no matter how the adjusting circuit is configured, the spirit of the present invention is obeyed as long as the decoding operation in the next iteration to be executed is adjusted when a detection operation identifies the occurrence of trapping set(s).

Moreover, the control apparatus 104 is capable of collaborating with any MPA based decoder, such as an offset min-sum algorithm (OMSA) decoder or a normalized min-sum algorithm (NMSA) decoder. Besides, the proposed control apparatus 104 is not limited to solving the problem caused by trapping set(s). That is, the spirit of the present invention is obeyed as long as statistics data of syndromes obtained from executed iterations is gathered, and a decoding operation in a next iteration to be executed is selectively adjusted according to the statistics data.

Those skilled in the art will readily observe that numerous modifications and alterations of the device and method may be made while retaining the teachings of the invention.

What is claimed is:

1. A method for controlling a message-passing algorithm (MPA) based decoding operation, comprising:
    updating a counter number by counting a number of successive times a syndrome of a current iteration is identical to a syndrome of a previous iteration, in order to gather statistics data of syndromes obtained from executed iterations; and
    selectively adjusting a decoding operation in a next iteration to be executed according to the statistics data.

2. The method of claim 1, wherein the step selectively adjusting the decoding operation in the next iteration to be executed comprises:
    detecting occurrence of trapping set(s) according to the statistics data; and
    when the occurrence of trapping set(s) is detected, adjusting the decoding operation in the next iteration to be executed.

3. The method of claim 1, wherein
    the step of selectively adjusting the decoding operation in the next iteration to be executed comprises:
    referring to the counter number for selectively adjusting the decoding operation in the next iteration to be executed.

4. The method of claim 3, wherein the step of updating the counter number comprises:
    when the syndrome of the current iteration is different from the syndrome of the previous iteration, resetting the counter number to an initial value; and
    when the syndrome of the current iteration is identical to the syndrome of the previous iteration, adding an adjustment value to the counter number.

5. The method of claim 3, wherein the step of referring to the counter number for selectively adjusting the decoding operation in the next iteration to be executed comprises:
    checking if the counter number reaches a target value; and
    when the counter number reaches the target value, adjusting the decoding operation in the next iteration to be executed, and resetting the counter number to an initial value.

6. The method of claim 1, wherein adjusting the decoding operation in the next iteration to be executed comprises:
    adjusting at least part of all channel values and at least part of all order sets.

7. The method of claim 1, wherein adjusting the decoding operation in the next iteration to be executed comprises:
    adjusting at least part of all channel values.

8. The method of claim 1, wherein adjusting the decoding operation in the next iteration to be executed comprises:
    adjusting at least part of all order sets.

9. The method of claim 1, wherein adjusting the decoding operation in the next iteration to be executed comprises:
    adjusting at least part of all A-Posteriori Probability (APP) values or at least part of all variable node values passed out.

10. A control apparatus for controlling a message-passing algorithm (MPA) based decoder, comprising:
    an adjusting circuit; and
    a detecting circuit, coupled to the adjusting circuit, for updating a counter number by counting a number of successive times a syndrome of a current iteration is identical to a syndrome of a previous iteration in order to gather statistics data of syndromes obtained from executed iterations, and selectively controlling the adjusting circuit to adjust a decoding operation in a next iteration to be executed according to the statistics data.

11. The control apparatus of claim 10, wherein the detecting circuit detects occurrence of trapping set(s) according to the statistics data; and when the occurrence of trapping set(s) is detected by the detecting circuit, the detecting circuit controls the adjusting circuit to adjust the decoding operation in the next iteration to be executed.

12. The control apparatus of claim 10, wherein the detecting circuit refers to the counter number for selectively controlling the adjusting circuit to adjust the decoding operation in the next iteration to be executed.

13. The control apparatus of claim 12, wherein when the syndrome of the current iteration is different from the syndrome of the previous iteration, the detecting circuit resets the counter number to an initial value; and when the syndrome of the current iteration is identical to the syndrome of the previous iteration, the detecting circuit adds an adjustment value to the counter number.

14. The control apparatus of claim 12, wherein the detecting circuit checks if the counter number reaches a target value; and when the counter number reaches the target value, the detecting circuit controls the adjusting circuit to adjust the decoding operation in the next iteration to be executed, and resets the counter number to an initial value.

15. The control apparatus of claim 10, wherein the adjusting circuit is arranged to adjust the decoding operation in the next iteration to be executed by adjusting at least part of all channel values and at least part of all order sets.

16. The control apparatus of claim 10, wherein the adjusting circuit is arranged to adjust the decoding operation in the next iteration to be executed by adjusting at least part of all channel values.

17. The control apparatus of claim 10, wherein the adjusting circuit is arranged to adjust the decoding operation in the next iteration to be executed by adjusting at least part of all order sets.

18. The control apparatus of claim 10, wherein the adjusting circuit is arranged to adjust the decoding operation in the next iteration to be executed by adjusting at least part of all A-Posteriori Probability (APP) values or at least part of all variable node values passed out.

\* \* \* \* \*